Jan. 11, 1966 R. ROWLAND 3,229,216
TUNABLE WIDE BAND PARAMETRIC AMPLIFIER WITH CORRECT REACTANCE AND EFFECTIVE RESISTANCE AT BOTH SIGNAL AND IDLER FREQUENCIES
Filed Feb. 25, 1963
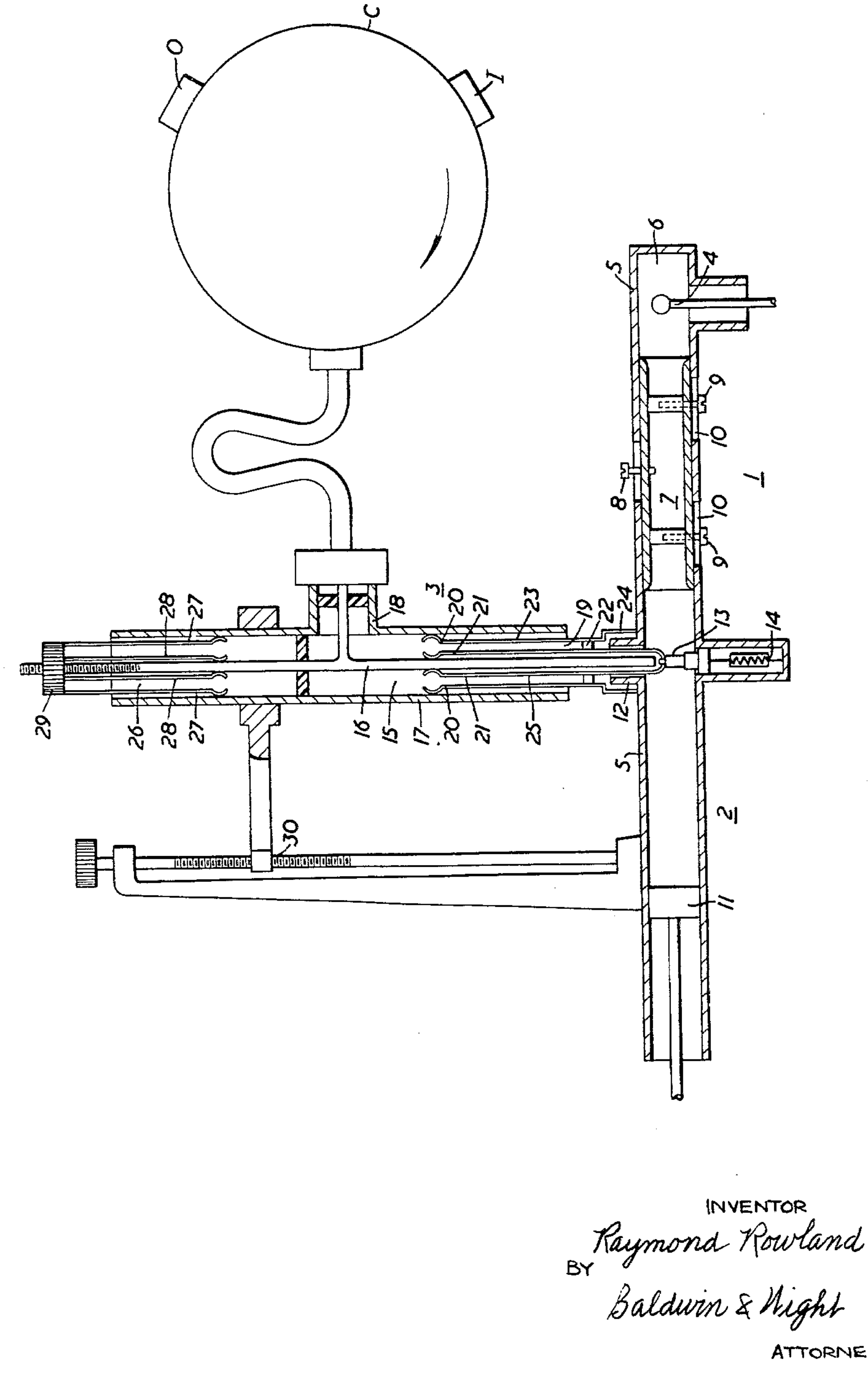
INVENTOR
Raymond Rowland
BY
Baldwin & Wight
ATTORNEYS United States Patent Office 3,229,216

Patented Jan. 11, 1966

3,229,216

TUNABLE WIDE BAND PARAMETRIC AMPLIFIER WITH CORRECT REACTANCE AND EFFECTIVE RESISTANCE AT BOTH SIGNAL AND IDLER FREQUENCIES

Raymond Rowland, Chelmsford, England, assignor to The Marconi Company Limited, a British company Filed Feb. 25, 1963, Ser. No. 260,535
Claims priority, application Great Britain, June 27, 1962, 24,684
9 Claims. (Cl. 330—4.9)

This invention relates to high frequency parametric amplifiers by which expression, in this specification, is meant amplifying or frequency changing arrangements in which signal frequency, idler frequency and pump frequency circuits are coupled by a varactor, i.e. a voltage-variable reactance, the amplification effect being obtained by utilising energy from a separate energy source providing the pump frequency. Such arrangements are of course well known and have achieved considerable favour. The main object of the invention is to provide improved and relatively simple parametric amplifiers which shall be tunable but at the same time of good efficiency at all tuning settings within the range of adjustment provided.

It is known that, in order to obtain good efficiency from a parametric amplifier, not only must the reactances of the signal frequency and idler frequency circuits be correctly chosen but also the loading or effective resistances thereof in order that the correct impedances shall be presented to the varactor. These requirements can be satisfied without series difficulty by proper design and dimensioning in the case of parametric amplifiers for use at fixed predetermined signal and idler frequencies but they are very difficult to satisfy in tunable parametric amplifiers, especially those required to be tunable over relatively wide frequency bands. In known tunable parametric amplifiers as at present in general use these requirements are not satisfied and variation of the reactances of the signal and idler frequency circuits for tuning purposes produces variation of the loading of these circuits but not such variation to or near optimum values. The present invention seeks to solve this problem.

According to this invention a variable tuning arrangement for a parametric amplifier comprises a wave guide structure having a first portion forming a signal frequency resonant circuit and a second portion forming idler frequency and pump frequency resonant circuits, one end of said first portion meeting the second at an intermediate point along the length thereof; a varactor mounted in the structure at the meeting place; means for feeding in pump frequency energy to the second portion on one side of said varactor; feeder means intermediate the ends of said first portion for feeding signal frequency input to said signal frequency resonant circuit and for taking an amplified signal frequency output therefrom; adjustable coupling means for varying the length of said first portion between said feder means and said one end to adjust the reactance of said signal frequency resonant circuit; tuning means slidably mounted near the other end of said first portion for independent adjustment of the effective resistance of said signal frequency resonant circuit; a reactance varying tuning member in said second portion on the other side of the varactor providing a short circuit to idler frequency energy, said tuning member being adjustable in position along the length of said idler frequency resonant circuit to adjust the reactance thereof; and an independently adjustable, pump circuit reactance varying tuning member slidable mounted in said second portion on said one side of said varactor and providing an adjustable short circuit to idler frequency energy for independent adjustment of the effective resistance of said idler frequency resonant circuit. The term waveguide structure is used in this specification in a wide sense to include high frequency wave conduit structures generally, e.g. wave guides properly so-called, and coaxials or equivalent guides.

The points at which signal input is fed in to and amplified output is taken off from the first portion may be the same point, the input and output signals being separated by a circulator or the like to which the common input-output point is connected. Alternatively separate input and output points may be provided in the first portion.

Preferably the pump circuit reactance varying tuning member in the second portion of the guide structure between the pump frequency input point and the varactor is incorporated in a band pass filter structure slidably mounted in said second portion to be longitudinally slidable therein and arranged to be lockable in any position of adjustment. A convenient form of filter comprises two plates opposite one another in said second portion and joined by two posts so spaced as to form a resonant cavity therebetween with a tuning screw which is adjustable as to its depth of penetration into said cavity screwed through one of the said plates.

Preferably the reactance varying tuning member in the second portion of the guide on the side of the varactor remote from the pump frequency input point is a short circuiting plunger adjustable in position in the open end of said second portion.

Preferably also the first portion is telescopically arranged with respect to the second portion so that its length, as measured from the meeting place of the portions, is adjustable, a plunger device fixed in relation to the second portion making sliding contact with the first portion and a short-circuiting plunger being slidable in the end of the first portion remote from the second portion.

Preferably again the first portion is a coaxial and the plunger device comprises two mutually insulated spring brush members, one contacting with the inside of the outer conductor of the coaxial and the other contacting with the outside of the inner conductor of the coaxial. The short circuiting plunger in the end of the first portion remote from the second portion may conveniently comprise two spring brush members connected together, one contacting with the inside of the outer conductor of the coaxial and the other contacting with the outside of the inner conductor of the coaxial, said two brush members being movable longitudinally together in relation to the coaxial by means of an adjusting nut screwed on one of the coaxial conductors.

The outer brush member forming part of the plunger device is preferably attached to the outside of the second portion and surrounds and is spaced from a T-neck formed on said second portion so as to constitute therewith a choke for idler frequency energy.

The invention is illustrated in the accompanying drawing in which the sole figure is a schematic part sectional view of the normal idler and pump frequency circuit arrangements for a parametric amplifier in accordance with the invention.

Referring to the drawing the arrangement therein illustrated comprises a pump frequency section generally designated 1, an idler frequency section generally designated 2, and a signal frequency section generally designated 3. Pump section 1 comprises an input probe 4 inserted in a wave guide 5 which is of rectangular cross-section with its narrow end wall referenced 6. In the wave guide 5 is a band pass filter generally designated 7, the centre frequency of which can be adjusted by a tuning screw 8. The filter can be slid along the wave guide 5 and clamped in any position of adjustment within the range by clamping screws 9 which pass through longitudinal slots 10 in the wave guide. In use the filter 7 is tuned to pass the pump frequency which is fed in via the probe 4 from a pump frequency source (not shown). The idler circuit 2, which, as shown, is provided by the extension of the wave guide 5 beyond the filter, is adjustable in length in two ways namely by moving a short circuiting plunger 11 inserted in the guide and by sliding the filter 7 which acts as a short-circuiting plunger for energy of the idler frequency. The wave guide 5 has a T-junction 12 by means of which the signal frequency circuit 3 couples with the idler frequency circuit. At the T-junction is a varactor 13 which couples the pump circuit, the idler circuit, and the signal circuit in well known manner. The varactor is controlled in reactance by self-biasing the voltage developed across resistance 14. The signal frequency circuit comprises a coaxial line 15 with inner and outer conductors 16 and 17. The co-axial line is provided with feeder means comprising a T-junction 18 through which signal frequency energy is fed in and amplified output is taken off, the input and output being separated by a circulator or equivalent device C of known form, to which the T-junction 18 leads and which has inlet and outlet points I and O. In place of the common input and output T-junction 18 and circulator C, separate T-junctions for input and output may be provided.

In the end of the coaxial line 15 nearer the wave guide 5 is a metal spring brush member generally designated 19 with an outer ring of spring contact fingers 20 pressing out against the inside of conductor 17 and an inner ring of spring contact fingers 21 pressing in against the outside of conductor 16. The spring fingers are mechanically united in their correct relative positions by an insulating annular member 22. The outer spring fingers extend from a cylinder 23 which is enlarged at its far end 24 and is fixed to the guide 5, being spaced from the T-member 12 formed in the guide to provide at this point a choke dimensioned to prevent idler frequency energy passing into the signal frequency circuit. The inner spring fingers extend from a cylinder 25 which, at its end away from said fingers, is split to form further spring contacts which engage on the terminal end of the varactor 13.

In the end of the coaxial line 15 away from the guide 5 is a second generally similar metal spring brush member 26 with outer spring fingers 27 engaging conductor 17 and inner spring fingers 28 engaging conductor 16. These two rings of spring fingers are mechanically and electrically united by a metal nut 29 engaging a screw cut on conductor 16 so that the brush member 26 is a short-circuit between conductors 17 and 16 at a position which can be adjusted by screwing the nut 29.

The coaxial line 15 can be moved as a whole by turning a lead screw 30 carried in a suitable fixed support and on which is a nut from which the outer conductor 17 is supported as shown. As will be apparent, when the lead screw 30 is rotated the depth of penetration of the brush member 19 into the coaxial is varied.

The reactance of the idler frequency circuit is adjusted by adjusting the position of plunger 11 in guide 5 and the reactance of the signal circuit is adjusted by adjusting the depth of penetration of the brush member 19 into the coaxial line 15 by rotating the lead screw 30. The provision of the independent adjustments for the position of filter 7 and the position of plunger 11 in the guide 5 enable not only the reactance of the idler frequency circuit to be adjusted but also (by adjusting the position of the varactor in said idler frequency circuit) the loading or effective resistance of the idler frequency circuit. This enables the idler circuit to be adjusted for satisfactory operation over a wide range of operating frequencies. As will be obvious variation of the positions of the filter 7 and the plunger 11 in the guide may produce variations of the coupling of the varactor with the pump frequency circuit but this is not a critical or serious matter and, in practice, any adjustments adopted will result in sufficient pump frequency energy being available for any slight mismatch between the pump frequency circuit and the varactor to be ignored.

Again the independent adjustments provided for the positions of the brush members 26 and 19 with respect to the coaxial line 15 enable the reactance of the signal frequency circuit and its loading or effective resistance to be independently adjusted.

I claim:

1. A parametric amplifier tuning arrangement comprising a wave guide structure having a first portion forming a signal frequency resonant circuit and a second portion forming idler frequency and pump frequency resonant circuits, one end of said first portion being coupled intermediate the ends of said second portion; a varactor mounted in the wave guide structure at the coupling place; means for feeding pump frequency energy into said pump frequency resonant circuit in said second portion on one side of said varactor; feeder means intermediate the ends of said first portion for feeding a signal frequency input into the signal frequency resonant circuit and for taking an amplified signal frequency output therefrom; adjustable coupling means for varying the length of said first portion between said signal feeder means and said one end to adjust the reactance of said signal frequency resonant circuit; tuning means slidably mounted near the other end of said first portion for providing an adjustable short circuit to signal frequency energy for independent adjustment of the effective resistance of said signal frequency resonant circuit to optimum loading values; a reactance varying tuning member in said second portion on the other side of the varactor providing a short circuit to idler frequency energy, said tuning member being adjustable in position along the length of said idler frequency resonant circuit to adjust the reactance thereof; and a pump circuit reactance varying tuning member in said pump frequency resonant circuit, the last-mentioned tuning member being slidably mounted in said second portion on said one side of the varactor and providing an adjustable short circuit to idler frequency energy for independent adjustment of the effective resistance of said idler frequency resonant circuit to optimum loading values.

2. An arrangement as claimed in claim 1, wherein the points at which signal frequency input is fed into and amplified signal frequency output is taken off from said signal frequency resonant circuit are a single common point, said arrangement further comprising a circulator connected to said single common point for separating the signal frequency input and the amplified signal frequency output.

3. An arrangement as claimed in claim 1, wherein a separate signal frequency input point and a separate amplified signal frequency output point are provided in the first portion.

4. An arrangement as claimed in claim 1, wherein the pump circuit reactance varying tuning member comprises a band pass filter structure slidably mounted in said second portion to be longitudinally slidable therein, and means for locking said filter in any position of adjustment.

5. An arrangement as claimed in claim 4, wherein said band pass filter comprises two plates disposed opposite one another in said second portion, two posts joining said plates, the plates and the posts being so spaced as to form a resonant cavity there-between, and a tuning screw screwed through one of said plates and having a depth of penetration into said cavity which is adjustable to control the center frequency of the band pass filter.

6. An arrangement as claimed in claim 1, wherein said adjustable coupling means comprises a telescopic part of said first portion situated between said signal feeder means and said one end of the first portion.

7. An arrangement as claimed in claim 1, wherein said first portion has two parts, one of which parts is a coaxial line having an inner conductor and an outer cylindrical conductor coaxial therewith; said signal feeder means comprises a further coaxial line, the inner conductor of which is connected to the inner conductor of the first-mentioned coaxial line; and said adjustable coupling means includes inner and outer spring conductive members making resilient contact, respectively, with the inner conductor and the outer conductor of the first-mentioned coaxial line and arranged to allow axially sliding movement of said two parts of the first portion while maintaining electrical contact between said two parts.

8. An arrangement as claimed in claim 7, wherein said spring conductive members extend to constitute the other part of the first portion, the outer spring conductive member terminating in a cylinder, the end of which makes contact with the wall of said second portion and surrounds an aperture therein, and wherein said inner spring conductive member passes through said aperture and makes contact with said varactor.

9. An arrangement as claimed in claim 8, wherein a conductive cylinder is mounted within the cylindrical terminating end of the outer spring conductive member, said conductive cylinder being spaced from said outer spring conductive member and being mounted at its end around the periphery of said aperture to constitute a choke for idler frequency energy.

References Cited by the Examiner

Gittinger, "Proceedings of the National Electronics Conference 1960," pages 462–471.

Petlai et al., "Proceedings of the IRE," July 1960, pages 1323–1324.

ROY LAKE, *Primary Examiner.*